(12) United States Patent  
Kim et al.

(10) Patent No.: US 7,450,415 B2  
(45) Date of Patent: Nov. 11, 2008

(54) PHASE-CHANGE MEMORY DEVICE

(75) Inventors: Du-eung Kim, Yongin-si (KW);
Chang-soo Lee, Yougin-si (KR);
Woo-yeong Cho, Suwon-si (KR);
Beak-hyung Cho, Hwaseong-si (KR);
Byung-gil Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/640,956

(22) Filed: Dec. 19, 2006

(65) Prior Publication Data

US 2007/0153616 A1 Jul. 5, 2007

(30) Foreign Application Priority Data

Jan. 4, 2006 (KR) ............ 10-2006-0001011

(51) Int. Cl.
*G11C 11/00* (2006.01)
(52) U.S. Cl. .................. 365/163; 365/147
(58) Field of Classification Search ............ 365/163, 365/147
See application file for complete search history.

(56) References Cited

U.S. PATENT DOCUMENTS 6,831,856 B2 * 12/2004 Pashmakov ............ 365/163
2005/0030800 A1 * 2/2005 Johnson et al. ........... 365/200
2005/0128785 A1 * 6/2005 Kang ..................... 365/147
2007/0217254 A1 * 9/2007 Matsuoka et al. ......... 365/163

FOREIGN PATENT DOCUMENTS

| JP | 2004-185755 | 7/2004 |
|---|---|---|
| JP | 2004-186553 | 7/2004 |
| KR | 1020030014613 A | 2/2003 |
| KR | 10-2004-0074088 | 8/2004 |
| KR | 1020050046401 A | 5/2005 |
| KR | 1020050115539 A | 12/2005 |

* cited by examiner

*Primary Examiner*—Michael T Tran
(74) *Attorney, Agent, or Firm*—Volentine & Whitt, P.L.L.C.

(57) ABSTRACT

A phase-change memory device is provided. The phase-change memory device includes a phase-change memory cell array including a first memory block having a plurality of phase-change memory cells each connected between each of a plurality of bit lines and a first word line, a second memory block having a plurality of phase-change memory cells each connected between each of the plurality of bit lines and a second word line, and first and second pull-down transistors pulling-down each voltage level of the first and the second word lines and sharing a node and a row driver including a first and a second pull-up transistor pulling-up each voltage level of the first and the second word lines.

27 Claims, 12 Drawing Sheets

PHASE-CHANGE MEMORY DEVICE

BACKGROUND OF THE INVENTION

1. Field of the Invention

The disclosed methods and systems relate to a phase-change memory device, and more particularly, to a phase-change memory device with improved current driving capacity and a method of fabricating the same.

This application claims priority from Korean Patent Application No. 10-2006-0001011 filed on Jan. 4, 2006 in the Korean Intellectual Property Office, the disclosure of which is incorporated herein by reference in its entirety.

2. Description of the Related Art

Phase-change random access memories (PRAMs) store data using a phase-change material, such as any number of chalcogenide alloys that can take either a crystalline state or an amorphous state based on a particular heating and cooling process applied to the material. The resistance of a phase-change material in its crystalline form is relatively low compared to the resistance of the phase-change material in it amorphous form. Generally, the crystalline state is referred to as a set (or "0") state and the amorphous state is referred to as a reset (or "1") state.

A phase-change memory is a device that includes a plurality of phase-change memory (PCM) cells disposed at positions where a plurality of bit lines and a plurality of word lines intersect. Each PCM cell has a device composed of a phase-change material whose resistance varies depending on its state (crystalline or amorphous) and an access device (e.g., a cell diode) controlling the current flowing through the phase-change material.

FIG. 1 is a circuit diagram of a conventional phase-change memory device 1. As shown in FIG. 1, the conventional phase-change memory device 1 includes a phase-change memory (PCM) cell array 2 and a row driver 6. The PCM cell array 2 includes a plurality of PCM cells 3 connected between each of a plurality of bit lines BL0~BLn and of both word lines WL0 and WL1. The row driver 6 includes an inverter consisting of a pull-up transistor 7 and a pull-down transistor 8, and operates to adjust the voltage levels of the word lines WL0 and WL1 in response to row address signals XS0 and XS1.

To read or write data stored in the PCM cells 3, one of the bit lines BL0~BLn and one of the word lines WL0 and WL1 must be selected. For example, when the PCM cell 3 (which is connected between bit line BLn and word line WL1) is selected, a current (shown passing through current path 5) will pass through the PCM cell 3 as a result, thus enabling a data read or write operation.

Since each of the word lines WL0 and WL1 may have a large intrinsic resistance (shown as resistors R_WL0, R_WL1) only a limited number of PCM cells can be connected with a given word line. Further, in order to properly operate such a high-resistance word line, the row driver 6 must have a high current driving capacity.

SUMMARY OF THE INVENTION

The disclosed methods and systems provide a phase-change memory device with improved current driving capacity.

The above and other objects of the present disclosed methods and systems will be described in or be apparent from the following description of the preferred embodiments.

According to an aspect of the disclosed methods and systems, there is provided a phase-change memory device including a phase-change memory cell array including a first memory block having a plurality of phase-change memory cells each connected between each of a plurality of bit lines and a first word line, a second memory block having a plurality of phase-change memory cells each connected between each of the plurality of bit lines and a second word line, and first and second pull-down transistors pulling-down each voltage level of the first and the second word lines and sharing a node; and a row driver including a first and a second pull-up transistor for pulling-up each voltage level of the first and the second word lines.

According to another aspect of the disclosed methods and systems, there is provided a phase-change memory device including a first memory block including a plurality of phase-change memory cells each connected between each of a plurality of bit lines and a first word line; a second memory block having a plurality of phase-change memory cells each connected between each of the plurality of bit lines and a second word line; and a first and a second pull-down transistor pulling-down each voltage level of the first and the second word line and sharing a node.

According to still another aspect of the disclosed methods and systems, there is provided a phase-change memory device including a semiconductor substrate; a first and a second pull-down transistor including a first and a second gate electrode extending in a predetermined direction on the semiconductor substrate, a common junction region formed in the semiconductor substrate between the first and second gate electrodes, a first junction region formed opposite to the first common junction region with respect to the first gate electrode, and a second junction region formed opposite to the first common junction region with respect to the second gate electrode; a first conductive line extending so as to intersect the first and second gate electrodes on the semiconductor substrate; and a first and a second phase-change memory cell formed between each of the first and second junction regions and the first conductive line.

According to yet another aspect of the disclosed methods and systems, there is provided a phase-change memory device including a semiconductor substrate having a first active region and a second active region defined thereon; a first and a second pull-down transistor including a first and a second gate electrode extending in a predetermined direction on the first active region and the second active region, a first common junction region formed in the first active region formed between first and second gate electrodes, a first junction region formed opposite to the first common junction region with respect to the first gate electrode, and a second junction region formed opposite to the first common junction region with respect to the second gate electrode; a first conductive line extending so as to intersect the first and second gate electrodes on the semiconductor substrate; a first and a second phase-change memory cell formed between each of the first and second junction regions and the first conductive line; and a first and a second pull-down transistors including a second common junction region formed in the second active region between the first and second gate electrodes, a third junction region formed opposite to the second common junction region with respect to the first gate electrode, and a fourth junction region formed opposite to the second common junction region with respect to the second gate electrode.

BRIEF DESCRIPTION OF THE DRAWINGS

The above and other features and advantages of the disclosed methods and systems will become more apparent by describing in detail preferred embodiments thereof with reference to the attached drawings in which.

DETAILED DESCRIPTION OF THE INVENTION

Figure 1:
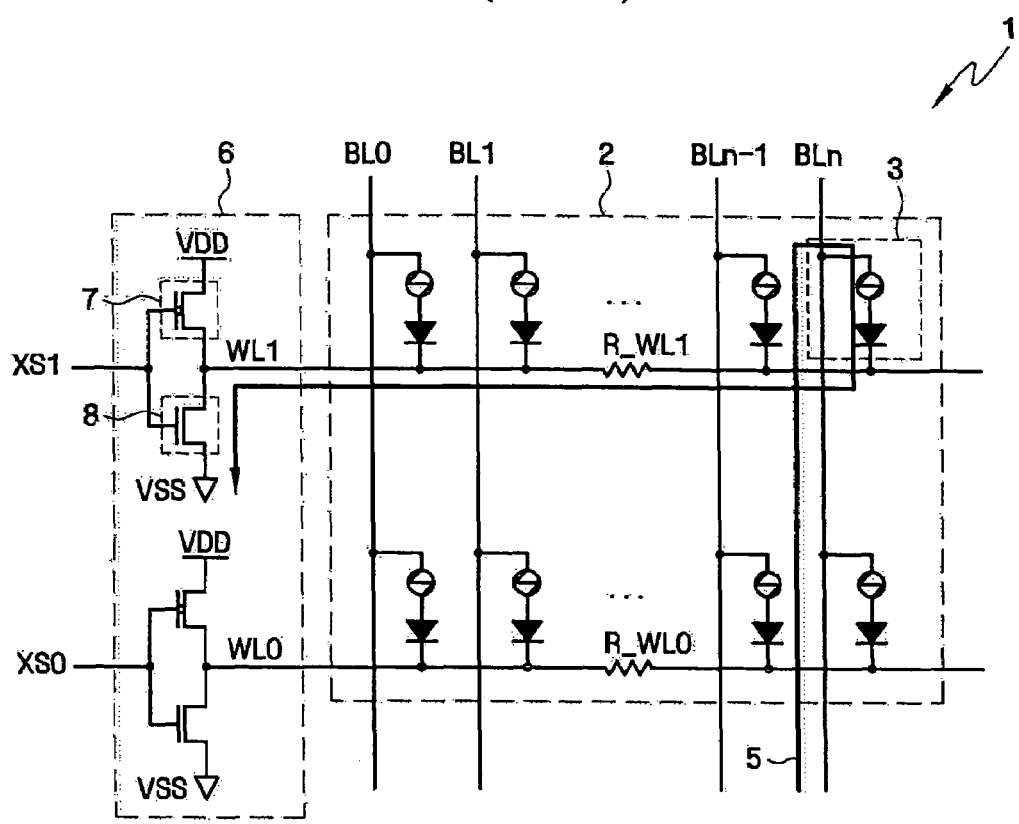
FIG. 1 a circuit diagram of a conventional phase-change memory device.

Advantages and features of the disclosed methods and systems may be understood more readily by reference to the following detailed description of preferred embodiments and the accompanying drawings. The disclosed methods and systems may, however, be embodied in many different forms and should not be construed as being limited to the embodiments set forth herein. Rather, these embodiments are provided so that this disclosure will be thorough and complete and will fully convey the concept of the invention to those skilled in the art, and the disclosed methods and systems will only be defined by the appended claims. Like reference numerals refer to like elements throughout the specification.

The disclosed methods and systems will now be described more fully with reference to the accompanying drawings, in which preferred embodiments of the invention are shown.

Figure 2:
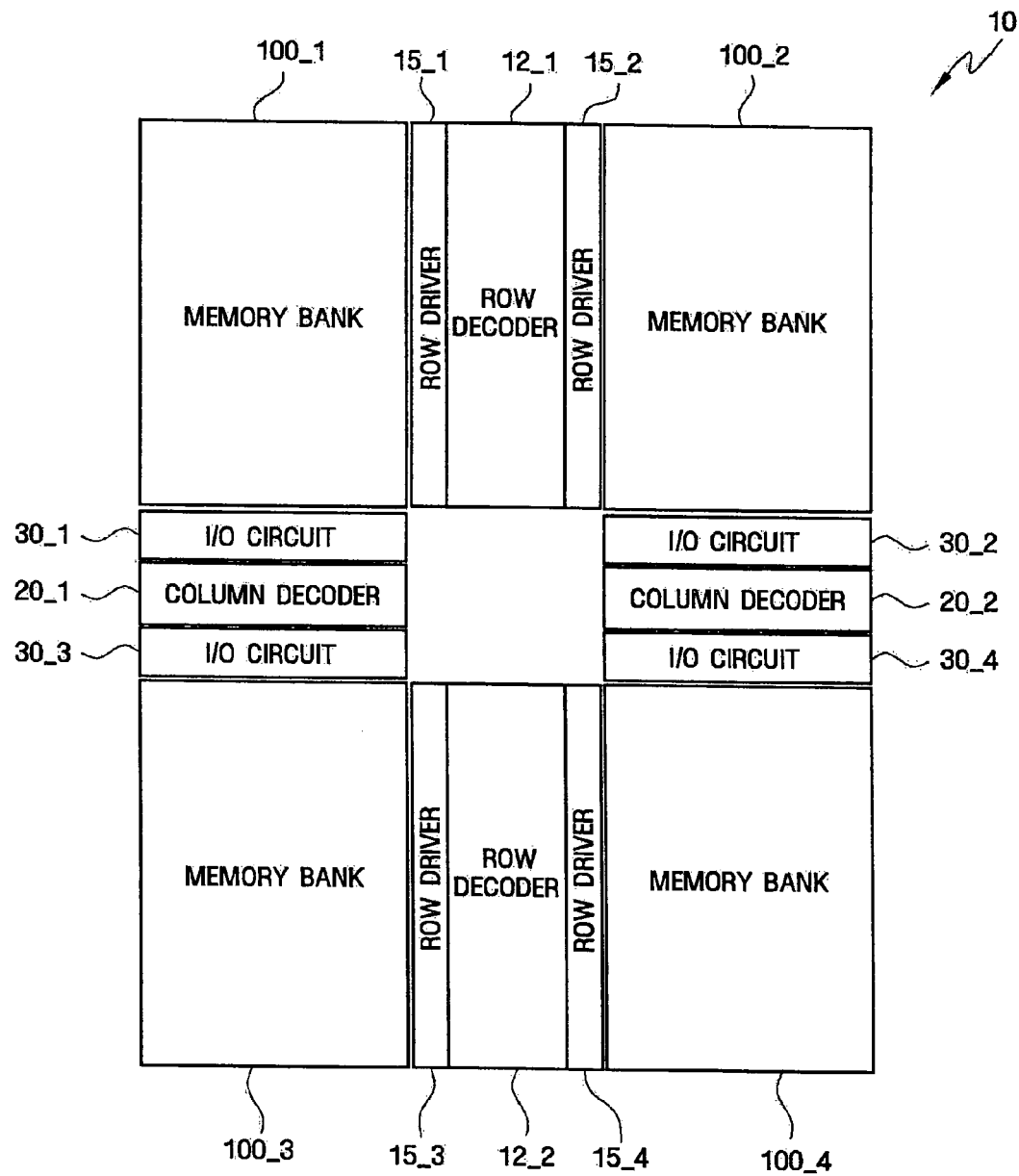
FIG. 2 is a block diagram of a phase-change memory device according to an embodiment of the disclosed methods and systems.

FIG. 2 is a block diagram of a phase-change memory device 10 according to an embodiment of the disclosed methods and systems. For convenience of explanation, an exemplary phase-change memory device 1 having four memory banks is illustrated. As shown in FIG. 2, the phase-change memory device 10 includes first through fourth memory banks 100_1~100_4, row decoders 12_1 and 12_2, row drivers 15_1~15_4, column decoders 20_1 and 20_2, and input/output (I/O) circuits 30_1~30_4. Each of the memory banks 100_1~100_4 includes a plurality of PCM cells arranged in a matrix array (not shown).

The row decoder 12_1 is arranged to service memory banks 100_1 and 100_2 to designate row addresses in the memory banks 100_1 and 100_2. Similarly, row decoder 12_2 is arranged to designate row addresses in memory banks 100_3 and 100_4.

The row drivers 15_1~15_4 adjust voltage levels of word lines corresponding to row addresses supplied from the row decoders 12_1 and 12_2.

The column decoders 20_1 and 20_2 are arranged corresponding to two memory banks 100_1~100_3 and 100_2~100_4, respectively, to designate column addresses in the first to fourth memory banks 100_1~100_4. For example, the column decoder 20_1 can select column addresses in the first memory bank 100_1 and third memory bank 100_3.

The I/O circuits 30_1~30_4 are arranged with respect to a corresponding memory bank 100_1~100_4, and operate to write data to and/or read data from the appropriate memory bank 30_1~30_4.

Figure 3:
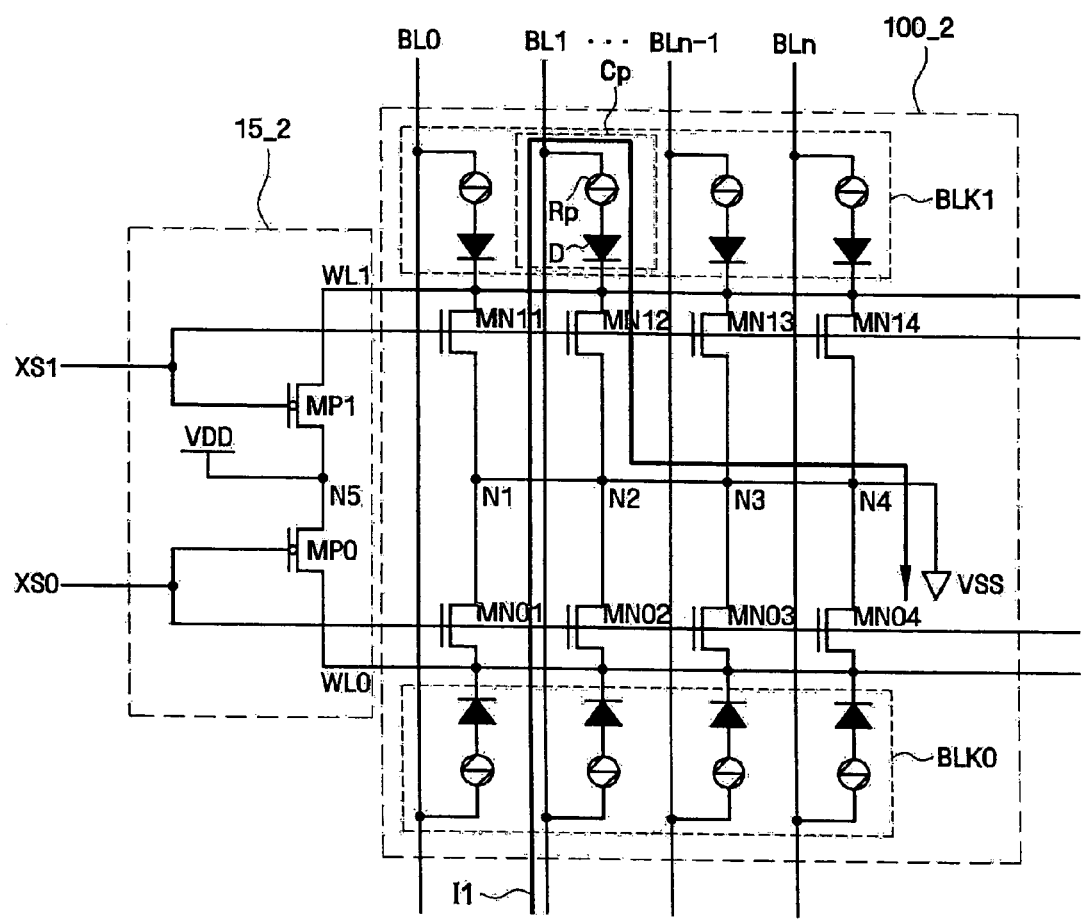
FIG. 3 is a circuit diagram of a phase-change memory device according to an embodiment of the disclosed methods and systems.

FIG. 3 is a circuit diagram of a phase-change memory device according to an embodiment of the disclosed methods and systems. While only memory bank 100_2 and row driver 15_2 are illustrated for brevity, it should be appreciated that the disclosed methods and systems can be applied to the other memory banks 100_1, 100_3 and 100_4 and the other row drivers 15_1, 15_3 and 15_4 of FIG. 2.

As shown in FIG. 3, the memory block 100_2 of the phase-change memory device includes first memory block BLK0, a second memory block BLK1, a plurality of first pull-down transistors MN01~MN04 and a plurality of second pull-down transistors MN11~MN14. The second row driver 15_2 includes a first pull-up transistor MP0 and a second pull-up transistor MP1.

The first memory block BLK0 includes a plurality of PCM cells Cp connected between each of a plurality of bit lines BL0~BLn and the first word line WL0, and the second memory block BLK1 includes a plurality of PCM cells Cp connected between each of a plurality of bit lines BL0~BLn and the second word line WL1.

As discussed above, each PCM cell Cp can includes a resistive element Rp that can change between an amorphous state and a crystalline state, and further include an access element D capable of controlling current flowing through the variable resistive element Rp.

As shown in FIG. 3, the variable resistive element Rp can be connected between each of the bit lines BL0~BLn and its respective access element D. The exemplary access element D is a cell diode having a cathode coupled to the word lines WL0 and WL1 and an anode coupled to the variable resistive element Rp. Note that the positions of the variable resistive element Rp and the word lines WL0 and WL1 may be switched.

In various embodiments, the phase-change material may be a binary (two-element) compound such as GaSb, InSb, InSe. $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb (SeTe), or $Te_{81}Ge_{15}Sb_2S_2$. The most commonly used phase-change material is GeSbTe (GST). However, it should be appreciated that in other embodiments, any number of known or later developed materials may be used as long as they maintain certain desirable properties, such as the ability to change resistance based on a controlled application of heat.

The plurality of first pull-down transistors MN01~MN04 can pull-down the voltage level of the first word line WL0. Similarly, the plurality of second pull-down transistors MN11~MN14 can pull-down voltage level of the second word line WL1. While the disclosed methods and systems are shown and described by way of example with a plurality of first pull-down transistors. MN01~MN04 arranged so as to correspond to PCM cells of the first memory block cells BLK0 and a plurality of second pull-down transistors MN11~MN14 arranged so as to correspond to PCM cells of the second memory block cells BLK1, the disclosed methods and systems are not limited to the illustrated example. For example, in other embodiments the plurality of first pull-down transistors MN01~MN04 and the plurality of second pull-down transistors MN11~MN14 may be arranged so as to correspond to a predetermined number, e.g., two, of PCM cells of the first and second memory block cells BLK0 and BLK1.

Continuing, each of the plurality of first pull-down transistors MN01~MN04 and each of the plurality of second pull-down transistors MN11~MN14 may share each of corresponding nodes N1~N4, respectively. The respective nodes N1~N4 may be connected with the ground voltage VSS. By way of example, the first pull-down transistor MN02 can be connected between the first word line WL0 and the second node N2 with the gate of transistor MN02 connected and responsive to a first address signal XS0. Similarly, the second pull-down transistor MN12 can be connected between the second word line WL1 with the gate of transistor MN12 connected and responsive to a first address signal XS1.

In various embodiments, the first and second pull-up transistors MP0 and MP1 may selectively share a fifth node N5. The fifth node N5 may be connected with the power voltage VDD. As shown in FIG. 3, when the first and second pull-up transistors MP0 and MP1 are both PMOS transistors, they may share a source node. More particularly, the first pull-up transistors MP0 can be connected between the first word line WL0 and the fifth node N5 and gated responsive to the first address signal XS0, and the second pull-up transistor MP1 can be connected between the second word line WL1 and the fifth node N5 and gated responsive to the second address signal XS1.

An exemplary operation of the phase-change memory device 10 will now be described with reference to FIG. 3. During a write operation of the phase-change memory device 10, the variable resistive element Rp can be transformed into its amorphous state (i.e., logic level "1") by heating the phase-change material above its melting temperature Tm (using a current flowing through it) and then rapidly cooling the material. Otherwise, the variable resistive element Rp can be transformed into its crystalline state (i.e., logic level "0") by heating it to a temperature between its crystallization temperature Tx and melting temperature Tm, maintained at the same temperature for a predetermined period of time and then cooling the material. During write operations, a considerably large amount of write current can flow through the variable resistive element Rp in order to induce a phase transition. For example, write currents of about 1 mA and of about 0.6 to 0.7 mA may be applied for reset operation and set operation, respectively.

During a read operation of the phase-change memory device 10, stored data can be read from the PCM cell Cp by providing current of a sufficiently low level as to not induce a phase change to the variable resistive element Rp.

As described above, when the data is read from or stored in the PCM cell Cp, one bit line, e.g., BL1, among the plurality of bit lines BL0~BLn, is selected, and one word line, e.g., WL1, of the word lines WL0~WL1, is selected. Since the selected word line WL1 should go low, the second pull-down transistors MN11~MN14 corresponding to the selected word line WL1 will be turned on. Write/read current (as indicated by reference symbol I1) provided from a write/read circuit (not shown) can pass through the bit line BL1, the PCM cell Cp and the second pull-down transistor MN12 to pass to the ground voltage VSS.

In the phase-change memory device according to the disclosed methods and systems, the write/read current can pass through the first pull-down transistors MN01~MN04 or the second pull-down transistors MN11~MN14, which are positioned in the PCM cell array 100_2, without passing through a word line having a large resistance in order to pass to the ground voltage VSS. Thus, there is no limitation in the number of number of PCM cells that can be connected with the first and second word lines WL0 and WL1 based on their resistances. As a result, the current driving capacity of the row driver 15_2 can be increased.

Furthermore, since the first pull-down transistors MN01~MN04 and the second pull-down transistors MN11~MN14 share corresponding nodes N1~N4 within the PCM cell array 100_2, the first pull-down transistors MN01~MN04 or the second pull-down transistors MN11~MN14, which are individually formed, can have a higher integration degree than those formed within the PCM cell array.

Figure 4:
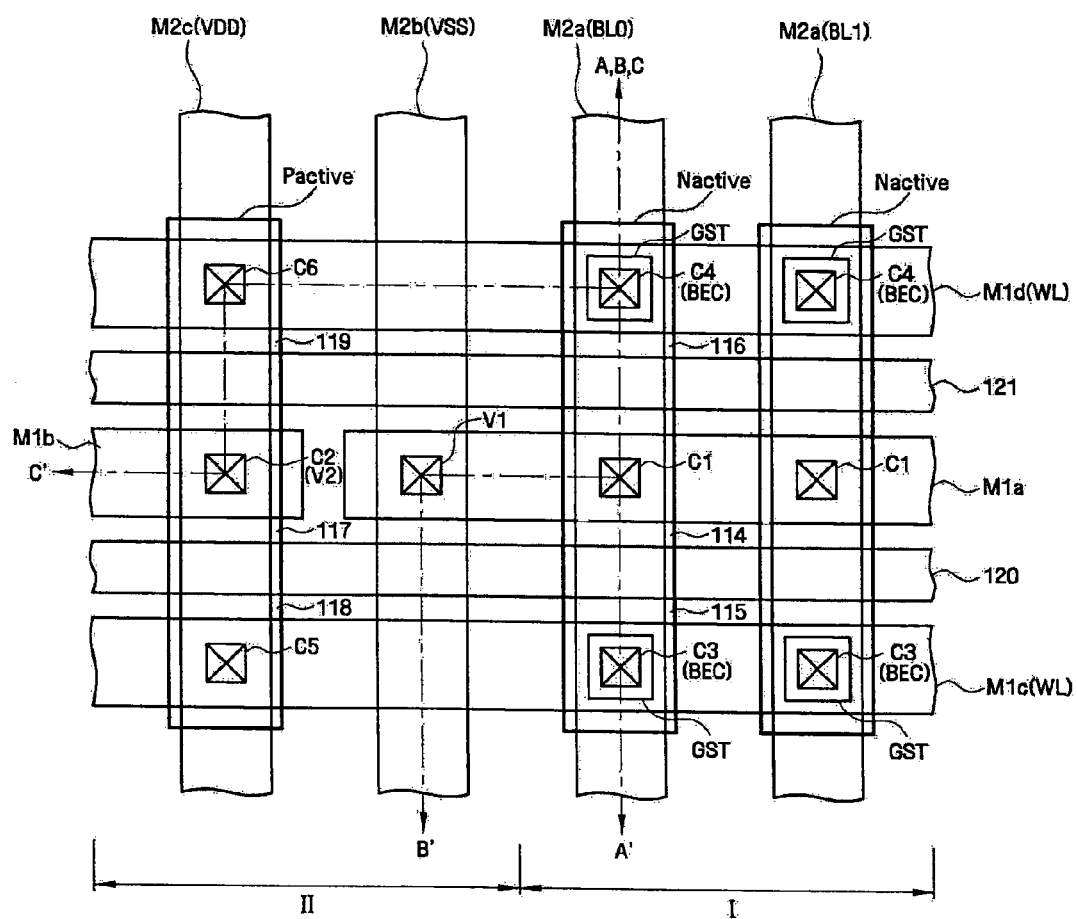
FIG. 4 is a layout view of a phase-change memory device according to an embodiment of the disclosed methods and systems.
Figure 5A:
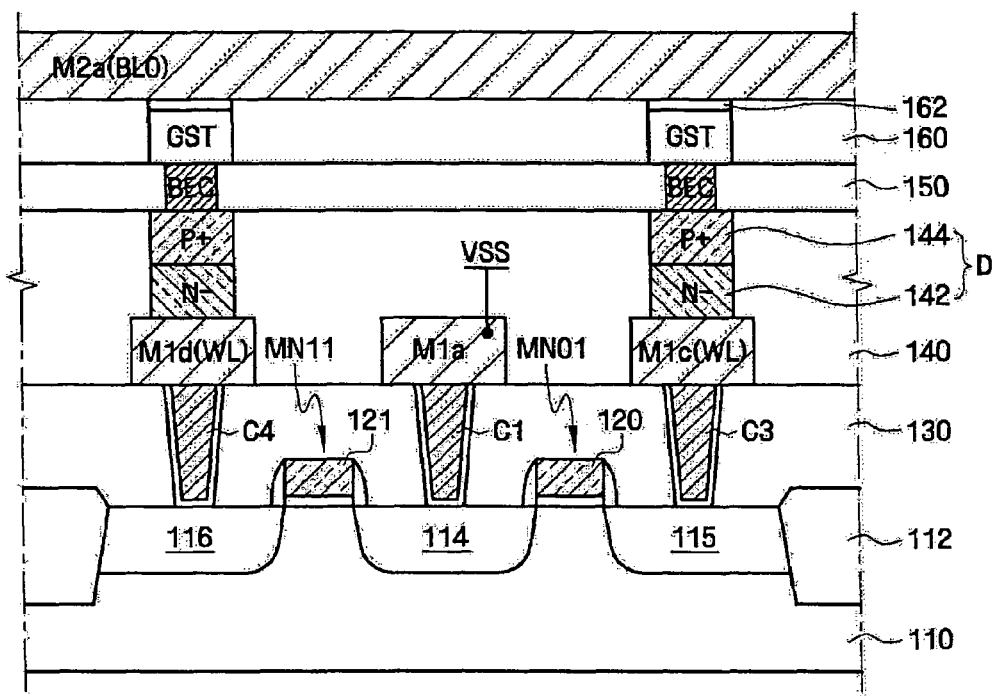
FIG. 5A is a cross-sectional view taken along the line A-A' of FIG. 4.
Figure 5B:
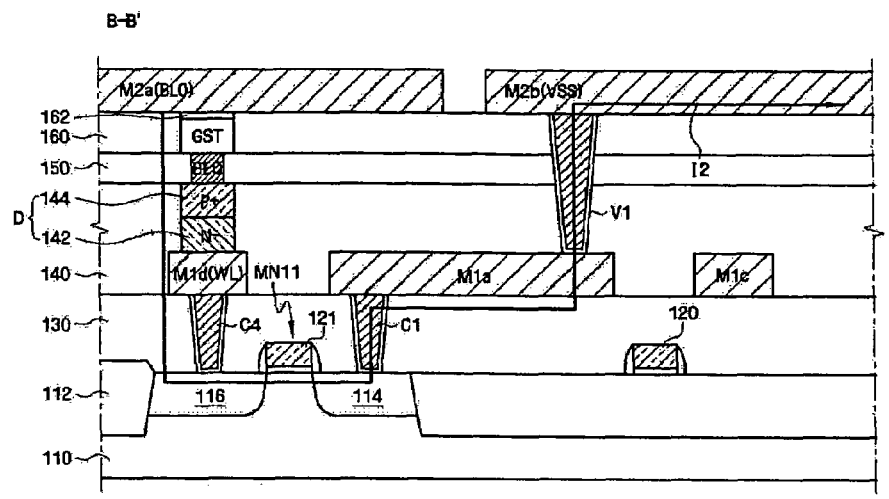
FIG. 5B is a cross-sectional view taken along the line B-B' of FIG. 4.
Figure 5C:
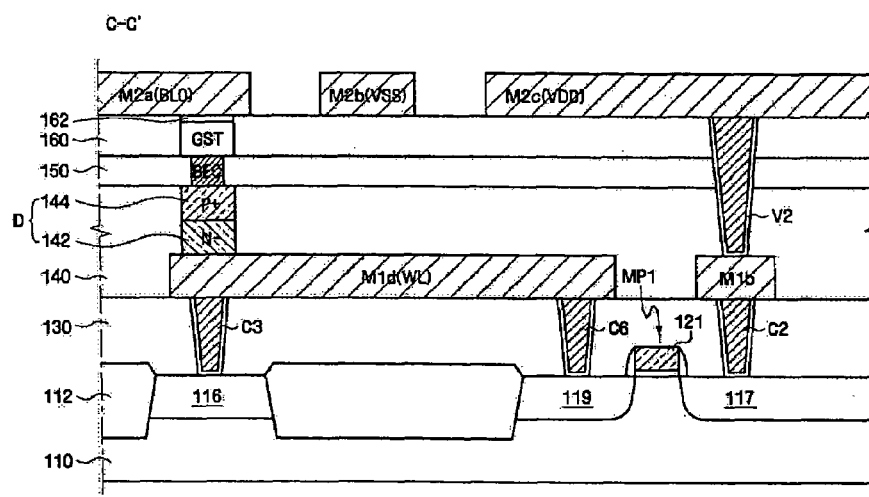
FIG. 5C is a cross-sectional view taken along the line C-C' of FIG. 4.
Figure 6:
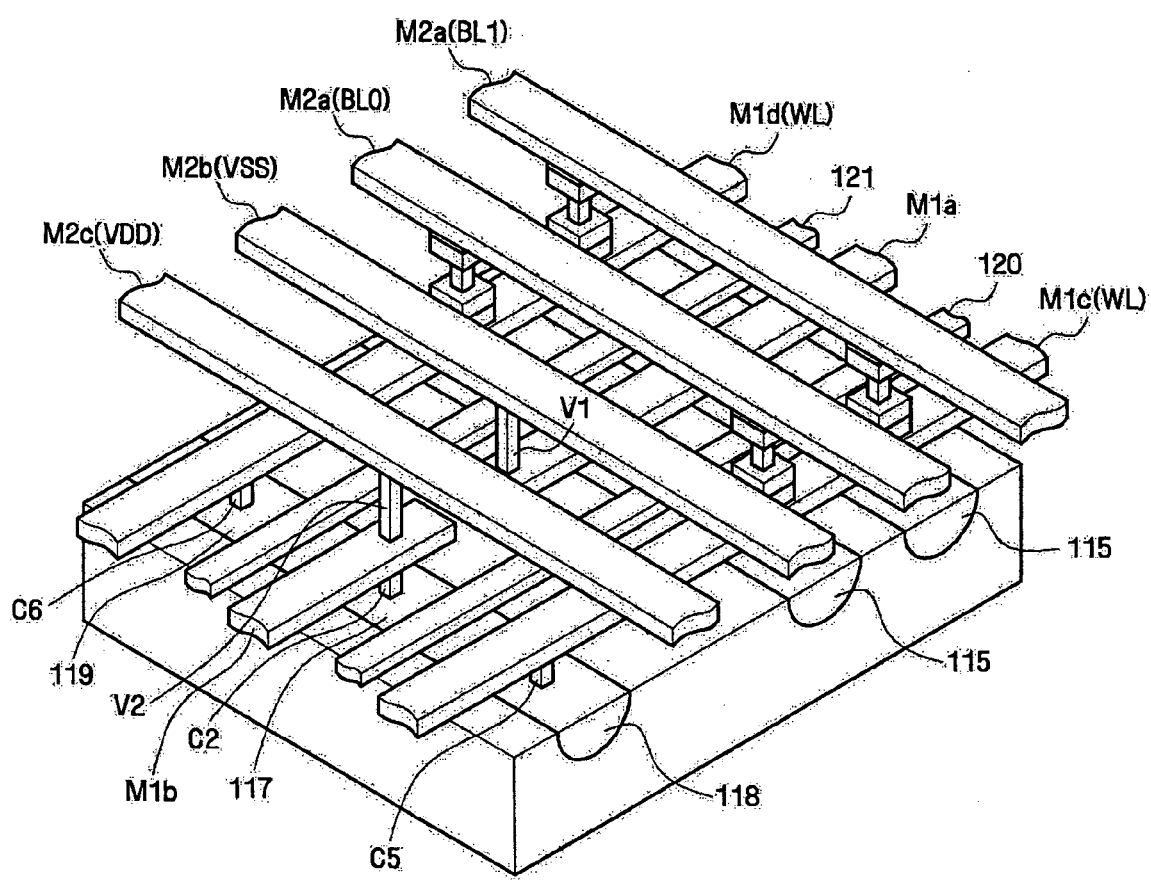
FIG. 6 is a perspective view of the phase-change memory device shown in FIG. 4.

FIG. 4 is a layout view of a phase-change memory device according to an embodiment of the disclosed methods and systems, FIG. 5A is a cross-sectional view taken along the line A-A' of FIG. 4, FIG. 5B is a cross-sectional view taken along the line B-B' of FIG. 4, and FIG. 5C is a cross-sectional view taken along the line C-C' of FIG. 4, and FIG. 6 is a perspective view of the phase-change memory device shown in FIG. 4. Note that an inter-layer dielectric layer, an inter-metal dielectric layer, or the like, are not shown in FIG. 6 for brevity.

Referring to FIGS. 3 through 6, a device isolation region 120 is disposed on a semiconductor substrate 110 of a first conductivity type (e.g., P-type) to define a first and a second active region respectively labeled "Nactive" and "Pactive" on the semiconductor substrate 110. A plurality of first active regions Nactives can be formed on the PCM cell array region I, and a plurality of second active regions Pactives can be formed on the row driver region II. In the present example, the semiconductor substrate 110 may be a silicon substrate, SOI (silicon on insulator), a Ga—As substrate, a Si—Ge substrate, a ceramic substrate, a quartz substrate, or a glass substrate for a display device. Further, the device isolation region 120 may be a flowable oxide (FOX) layer using local oxidation of silicon (LOCOS) or a shallow trench isolation (STI) region.

A plurality of first and second pull-down transistors MN01, MN11, MN02, and MN12 are formed on the PCM cell array region I and first and second pull-up transistors MP0 and MP1 are formed on the row driver region II.

The plurality of first and second pull-down transistors MN01, MN11, MN02, and MN12 can include first and second gate electrodes 120 and 121 extending in one direction on the first and second active regions Nactives and Pactives. Further, a first common junction region 114 can be formed in the first active region Nactive between the first and second gate electrodes 120 and 121, and a first junction region 115 can be formed opposite to the first common junction region 114 with respect to the first gate electrode 120. Additionally, a second junction region 116 can be formed opposite to the first common junction region 114 with respect to the second gate electrode 121.

In the present example, the first common junction region 114 corresponds to the nodes N1 and N2 (i.e., source nodes) shared by the first and second pull-down transistors MN01, MN11, MN02, and MN12, the first junction region 115 corresponds to drain nodes of the first pull-down transistors MN01 and MN02 and the second junction region 116 corresponds to drain nodes of the second pull-down transistors MN11 and MN12.

The first and second pull-up transistors MP0 and MP1 can include a second common junction region 117 formed in the second active region Pactive between the first and second gate electrodes 120 and 121. A third junction region 118 can also be formed opposite to the second common junction region 117 with respect to the first gate electrode 120. Similarly, a fourth junction region 119 can be formed opposite to the second common junction region 117 with respect to the second gate electrode 121.

Note that the second common junction region 117 corresponds to the node N5 (i.e., a source node) shared by the first and second pull-up transistors MP0 and MP1, the third junction region 118 corresponds to a drain node of the first pull-up transistor MP0 and the fourth junction region 119 corresponds to a drain node of the second pull-up transistor MP1.

Continuing, a gate insulating layer can be formed under the first and second electrodes 120 and 121. Additionally, a spacer can be formed on the sidewalls of the first and second gate electrodes 120 and 121. The first and second common junctions 114 and 117, as well as the first through fourth junction regions 115~119, can be formed within the first and second active regions Nactives and Pactives using the first and second gate electrodes 120 and 121 using the spacers as self-aligned ion implantation masks.

An interlayer dielectric (ILD) 130 having a plurality of contact holes exposing the first and second common junctions 114 and 117, as well as the first through fourth junction regions 115~119, can be formed on the semiconductor substrate 110. Here, the ILD 130 may be a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, or the like. Additionally, the ILD 130 may be formed by a suitable CVD process, such as an atomic layer deposition (ALD), a plasma enhanced atomic layer deposition (PEALD), a metal organic chemical vapor deposition (MOCVD), a plasma enhanced chemical vapor deposition (PECVD) and the like.

The plurality of contact holes include first and second contact C1 and C2 can connect with the first and second common junction regions 114 and 117, respectively. Similarly, a third through sixth contact C3~C6 can connect with the first through fourth junction regions 115~119, respectively.

A plurality of first conductive lines M1a, M1b, M1c and M1d extending in one direction are arranged on the first through sixth contacts C1~C6 and the ILD 130. Conductive line M1a is connected with the first common junction region 114 via the first contact C1. Conductive line M1b is connected with the second common junction region 117 via the second contact C2. Conductive line M1c is connected with the third contact C3 and the fifth contact so that the first junction region 115 is electrically connected with the third junction region 118. Conductive line M1d is connected with the fourth contact C4 and the sixth contact C6 so that the fourth junction region 116 is electrically connected with the sixth junction region 119. Note that the conductive lines M1c and M1d correspond to word lines. Also note that the plurality of first conductive lines M1a~M1d may be formed of aluminum or tungsten.

A first inter-metal dielectric (IMD) 140 that includes a plurality of openings exposing top surfaces of predetermined regions of the plurality of first conductive lines M1a ~M1d may be disposed on the plurality of first conductive lines M1a ~M1d and the ILD 130. Here, the IMD 140 may be composed of silicon oxide (SiOx), a flowable oxide (FOX) layer, a torene silazene (TOSZ) layer, an undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer or the like.

Each of the plurality of openings included in the first IMD 140 can be filled with a first semiconductor pattern 142 of a second conductivity type (e.g., N-type) and a second semiconductor pattern 144 of a first conductivity type (e.g., P-type) overlying the first semiconductor pattern 142. Pairs of the first and second semiconductor patterns 142 and 144 can be independently arranged on the first conductive lines M1a~M1d according to the positions of the plurality of openings.

The first and second semiconductor patterns 142 and 144 constitute access elements (cell diodes D). The second semiconductor pattern 144 may have a higher impurity concentration than the first semiconductor pattern 142 to prevent leakage current flowing through a reverse biased cell diode. A reverse bias may be applied to a cell diode D in an unselected PCM cell during a write or read operation.

While the plurality of openings included in the first IMD 140 can be filled with the first and second semiconductor patterns 142 and 144, conductive plugs may be selectively added to the second semiconductor patterns 144 to fill the plurality of openings. The conductive plugs may be metal plugs having resistive contacts, e.g., tungsten plugs.

Continuing, a second IMD 150 having a plurality of contact holes can be formed on the plurality of cell diodes D and the first IMD 140. The second IMD 150 may be made of silicon oxide (SiOx). Each of the plurality of contact holes can be filled with each bottom electrode contact (BEC), which in various embodiments may be made of TiN.

A plurality of variable resistance elements, generally abbreviated as GSTs, connected with the respective BECs, can be formed on the respective BECs and the second IMD 150. Phase-change materials forming the GST may be a binary (two-element) compound such as GaSb, InSb, InSe. $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn) SbTe, GeSb (SeTe), or $Te_{81}Ge_{15}Sb_2S_2$. The most commonly used phase-change material is GeSbTe.

A barrier layer 162 may be formed on the GST. The barrier layer 162 prevents diffusion between phase-change material of the GST and the materials of the second conductive lines M2a. In various embodiments, the barrier layer 162 may be made of titanium (Ti)/titanium nitride (TiN).

While the exemplary embodiment of the disclosed methods and systems has shown that the GST and the second conductive line M2a contact each other via the barrier layer 162, in various embodiments they may make contact via a top electrode contact further provided on the GST.

Note that portions other than the GST can filled with a third IMD 160.

Additionally, a plurality of "via holes" can be formed through the first, second and third IMDs 140, 150 and 160. The plurality of via holes can include a first via V1 connecting the conductive lines M1a with the conductive lines M2b, as well as a second via V2 connecting the conductive lines M1b with the conductive lines M2c.

A plurality of second conductive lines M2a, M2b, M2c and M2d are arranged on the GST and the third IMD 160 and extend so as to intersect the first and second gate electrodes 120 and 121. The conductive line M2a is connected with a plurality of GSTs. The conductive line M2b, which is supplied with a ground voltage VSS and connected with the first via V1, is connected with the first common junction region 114. The conductive line M2c, which is supplied with power voltage VDD and connected with the second via V2, is connected with the second common junction region 117. Here, the second conductive line M2a corresponds to a bit line. Note that in various embodiments the plurality of second conductive lines M2a ~M2d may be formed of aluminum or tungsten.

An operation of the phase-change memory device will now be described in further detail with reference to FIGS. 4 and 5B.

To read or write data stored in the PCM cells Cp, a read/write current passing through the GST via current path 12. The read/write current can be supplied along the conductive line (bit line) M2a, the GST, BEC, the cell diode D, the conductive line M1d, the fourth contact C4, the second pull-down transistor MN11, the first contact C1, the conductive line M1a, the first via V1 and the conductive line M2b to pass to the ground voltage VSS.

Figure 7:
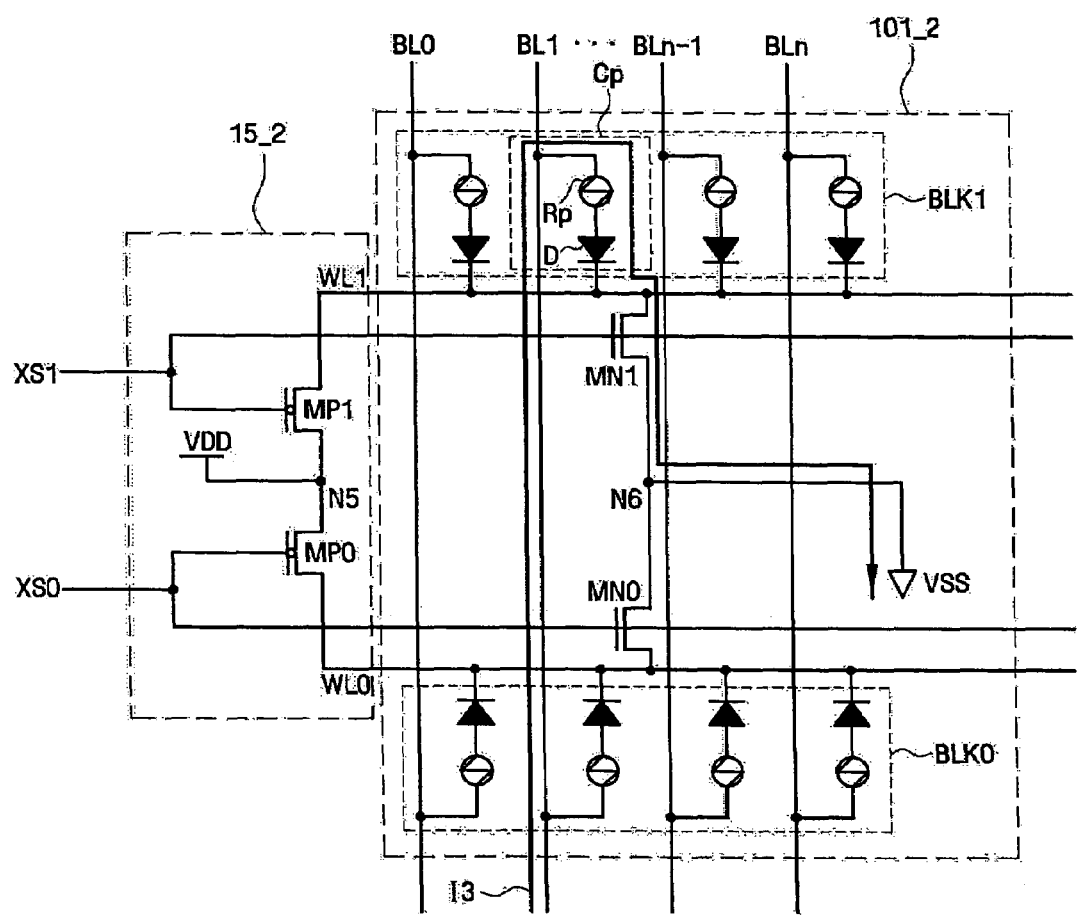
FIG. 7 is a circuit view of a phase-change memory device according to another embodiment of the disclosed methods and systems.

FIG. 7 is a circuit diagram of a phase-change memory device according to another embodiment of the disclosed methods and systems. Corresponding reference numerals similar to (or the same as) those given to respective components shown in FIG. 3 are omitted. As shown in FIG. 7, in the phase-change memory device, a first pull-down transistor MN01 is arranged so as to correspond to a first memory block cell BLK0, and a second pull-down transistor MN1 is arranged so as to correspond to a second memory block cell BLK1. The first and second pull-down transistors MN0 and MN1 share a node N6, which may be connected with a ground voltage VSS. When the first and second pull-down transistors MN0 and MN1 are both NMOS transistors, they may share a source node.

Current passing through a plurality of PCM cells Cp included in first and second memory block cells BLK0 and BLK1 can pass to the ground voltage VSS through the first and second pull-down transistors MN0 and MN1. For example, write/read current, as indicated by reference symbol 13, provided from a write/read circuit (not shown) can pass to the ground voltage VSS through a bit line BL1, the PCM cells Cp and the second pull-down transistor MN1.

Figure 8:
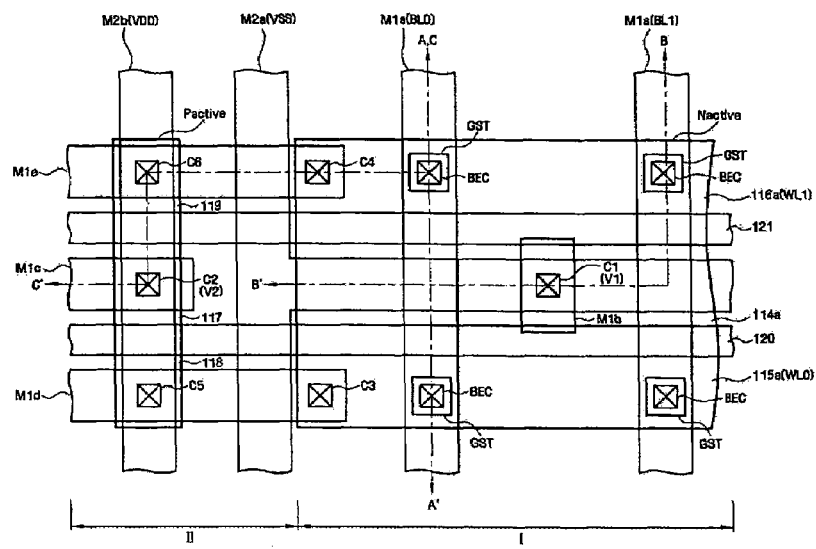
FIG. 8 is a layout view of a phase-change memory device according to another embodiment of the disclosed methods and systems.
Figure 9A:
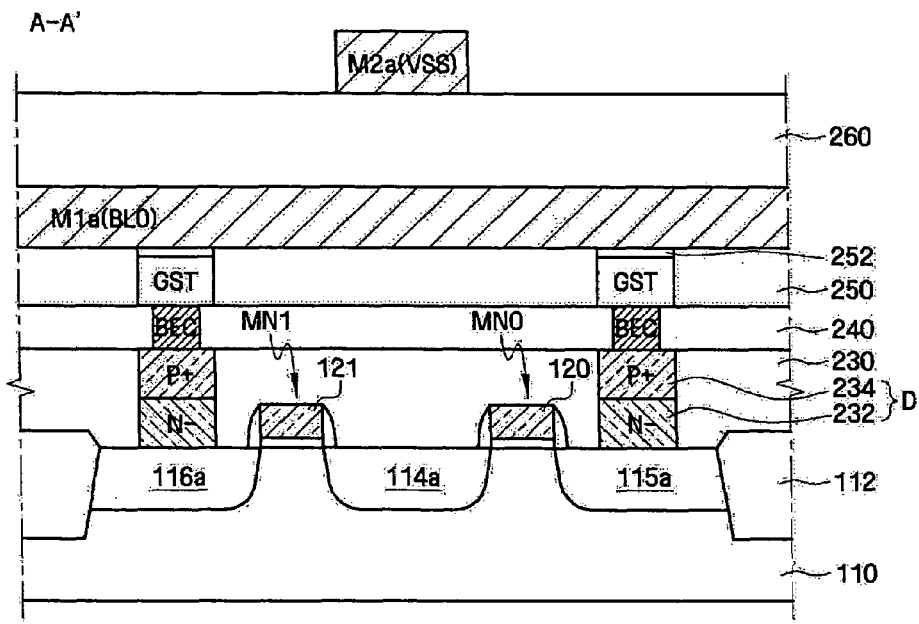
FIG. 9A is a cross-sectional view taken along the line A-A' of FIG. 8.
Figure 9B:
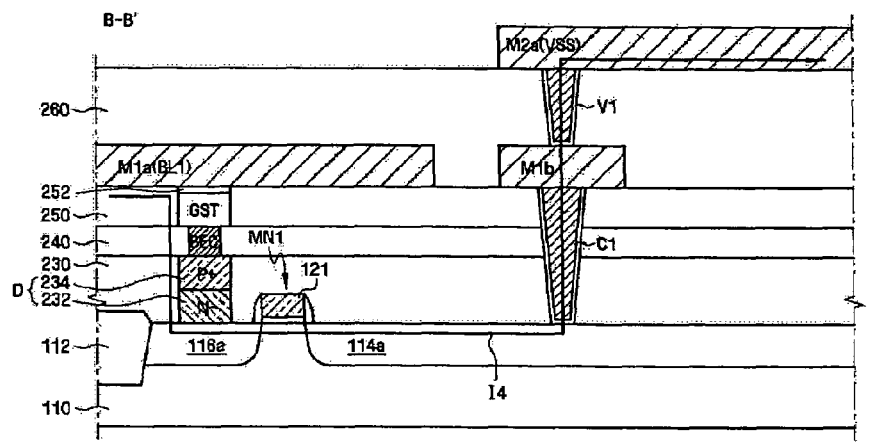
FIG. 9B is a cross-sectional view taken along the line B-B' of FIG. 8.
Figure 9C:
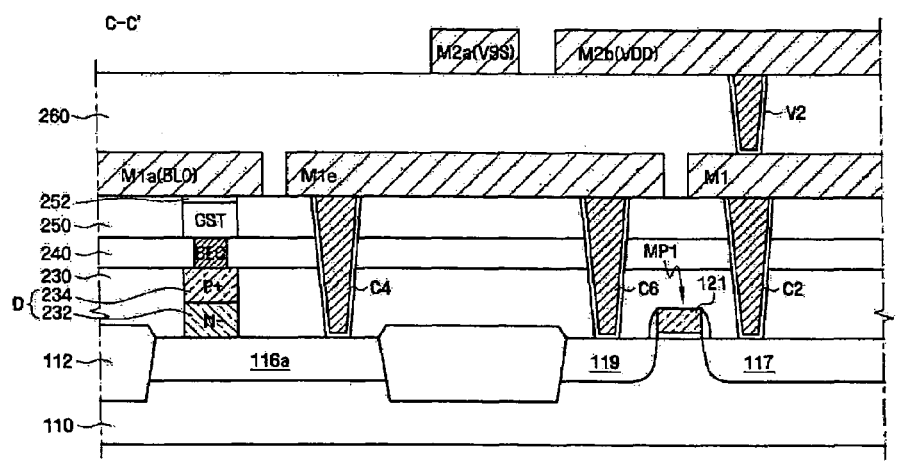
FIG. 9C is a cross-sectional view taken along the line C-C' of FIG. 8.
Figure 10:
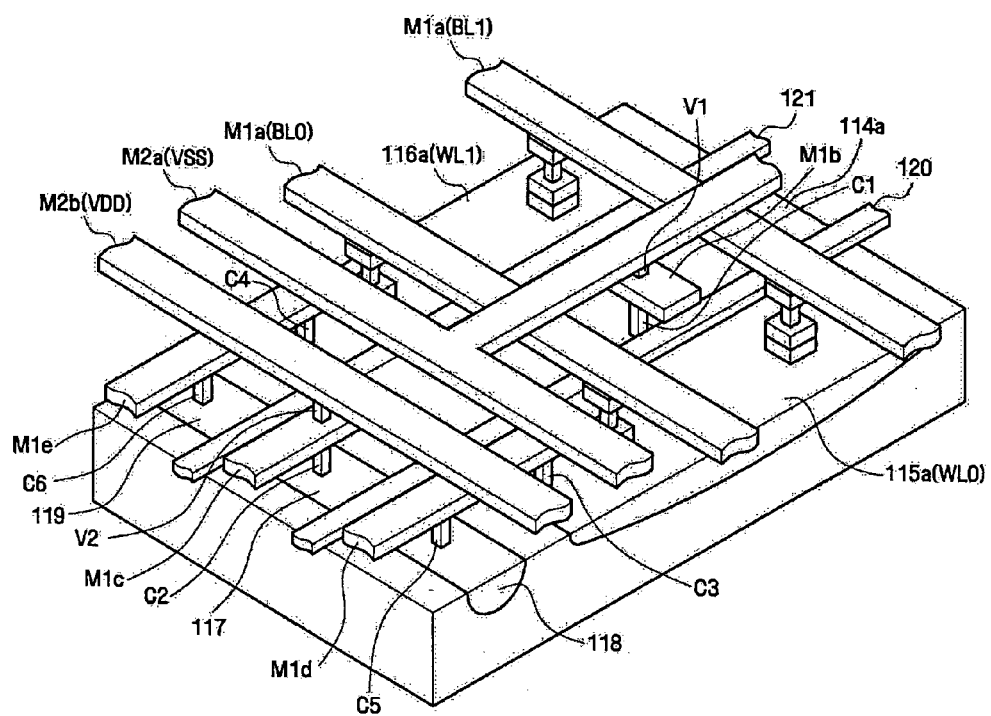
FIG. 10 is a perspective view of the phase-change memory device shown in FIG. 8.

FIG. 8 is a layout view useful for explaining steps of a method of manufacturing a phase-change memory device according to an embodiment of the disclosed methods and systems, FIG. 9A is a cross-sectional view taken along the line A-A' of FIG. 8, FIG. 9B is a cross-sectional view taken along the line B-B' of FIG. 8, FIG. 9C is a cross-sectional view taken along the line C-C' of FIG. 8 and FIG. 10 is a perspective view of the phase-change memory device shown in FIG. 8. Note that in FIG. 10, the ILD, IMD or other elements are not shown for the sake of simplicity.

Referring to FIGS. 7 through 10, a first and a second active region respectively-labeled "Nactive" and "Pactive" are defined on a semiconductor substrate 110 of a first conductivity type (e.g., P-type). The first and second pull-down transistors MN0 and MN1 are formed on the PCM cell array region I, and first and second pull-up transistors MP0 and MP1 are formed on the row driver region II. Here, first and second junction regions 115a and 116a can serve as word lines.

Note that in embodiments, since the first and second pull-down transistors MN0 and MN1 are formed corresponding to first and second memory blocks BLK0 and BLK1, respectively, the first and second pull-down transistors MN0 and MN1 can be larger than the corresponding transistors in the previous embodiment.

Continuing, a first interlayer dielectric (ILD) 230 having a plurality of contact holes can be formed on the semiconductor substrate 110. Each of the plurality of contact holes of the first ILD 230 can be filled with a first semiconductor pattern 232 of a second conductivity type (e.g., N-type) and a second semiconductor pattern 234 of a first conductivity type (e.g., P-type) overlying the first semiconductor pattern 232. Note that the first and second semiconductor patterns 232 and 234 can be independently arranged on the first junction regions 115a and 116a according to the positions of the plurality of openings. Also note that the first and second semiconductor patterns 232 and 234 can constitute access elements/cell diodes D.

A second ILD 240 having a plurality of contact holes can be formed on a plurality of cell diodes D and the first ILD 230. Each of the plurality of contact holes can be filled with each bottom electrode contact (BEC).

A plurality of variable resistance elements (generally abbreviated as GSTs) can be connected with the respective BECs and arranged on the BEC and the second ILD 240. A barrier layer 252 may be formed on the GST. Portions other than the GST are filled with a third ILD 250.

Continuing, a plurality of via holes can be formed through the first, second and third ILDs 230, 240 and 250. The plurality of via holes include a first contact C1 connected with a first common junction region 114a, a second contact C2 connected with a second common junction region 117, a third contact C3 connected with a first junction region 115a, a fourth contact C4 connected with a second junction region 116a, a fifth contact C5 connected with a third junction region 118 and a sixth contact C6 connected with a fourth junction region 119.

A plurality of conductive lines M1a, which extend so as to intersect first and second gate electrodes 120 and 121, are arranged on the plurality of GSTs and the third ILD 250. The plurality of conductive lines M1a correspond to bit lines. In addition, the conductive line M1b is arranged to connect with the first contact C1, and the conductive line M1c is arranged to connect with the second contact C2. Further, the conductive line M1d connected with the third contact C3 and the fifth contact C5 can be used to connect the first and third junction regions 115a and 118. Similarly, the conductive line M1e connected with the fourth contact C4 and the sixth contact C6 can connect the second and fourth junction regions 116a and 119.

An inter-metal dielectric (IMD) 260 that includes a plurality of via holes exposing top surfaces of predetermined regions of the plurality of first conductive lines M1a, M1b, M1c, M1d, and M1e may be disposed on the plurality of first conductive lines M1a~M1d and the third ILD 250. The plurality of via holes can include a first via V1 connected with the conductive line M1b and a second via V2 connected with the conductive line M2c.

A plurality of second conductive lines M2a and M2b can be arranged on the plurality of via holes and the IMD 260. The conductive line M2a, which is supplied by the ground voltage VSS, can be connected with the first via V1 to then be connected with the first common junction region 114a. Similarly, the conductive line M2c, which is supplied by power voltage VDD, can be connected with the second via V2 to then be connected with the second common junction region 117.

An operation of the phase-change memory device will now be described in further detail with reference to FIGS. 8 and 9B.

To read or write data stored in the PCM cells Cp, a read/write current passing through the GST can pass through a current path I4. The read/write current can pass to the ground voltage VSS through the GST, BEC, the cell diode D, the second pull-down transistor MN1, the first contact C1, the conductive line M1b, the first via V1 and the conductive line M2a.

Figure 11:
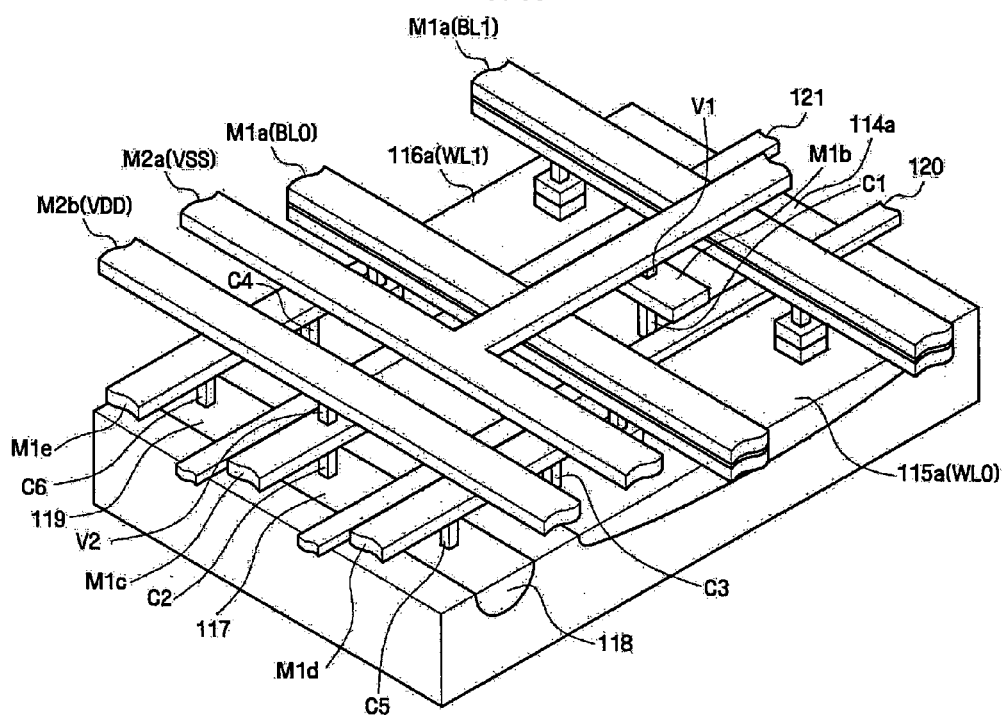
FIG. 11 is a cross-sectional view of a phase-change memory device according to still another embodiment of the disclosed methods and systems.

FIG. 11 is a perspective view of a phase-change memory device according to still another embodiment of the disclosed methods and systems. Corresponding reference numerals given to respective components shown in FIG. 10 are omitted. As shown in FIG. 11, according to still another embodiment of the disclosed methods and systems, a phase-change material constituting GSTs can extend in parallel with conductive lines M1a, i.e., bit lines BL0 and BL1. That is, the phase-change material can be arranged for a plurality of PCM cells rather than for each PCM cell. In order to make an etching process more efficient and accurate, the phase-change material can be patterned in strip types. As a result, the strip-type phase-change material has less stress, thereby exhibiting high endurance even after repeated write and reading operations.

While the method of fabricating phase-change memory device of still another embodiment of the disclosed methods and systems has been shown and described that the phase-change material constituting GSTs is completely parallel with bit lines, it will be understood by those of ordinary skill in the art that a portion of the phase-change material may extend parallel with bit lines. In addition, the phase-change material may extend parallel with word lines according to characteristics of the phase-change memory device. Further, a phase-change material may extend parallel with bit lines in such a manner as shown in FIG. 4.

As described above, according to the phase-change memory device of the disclosed methods and systems, a write/read current can pass to a ground voltage through pull-down transistors positioned in a phase-change memory cell array without passing through word lines exhibiting a considerably high level of resistance. Accordingly, the resistance of a word line cannot restrict the number of PCM cells that can be connected with a word line. That is, high current driving capacity of a row driver can be achieved without consideration of the resistance of a word line.

Further, since a first and a second pull-down transistor are formed in a phase-change memory cell array in corresponding memory blocks, the integration density of the phase-change memory device according to the disclosed methods and systems can be increased.

Example embodiments of the disclosed methods and systems have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the exemplary embodiments of the disclosed methods and systems as set forth in the following claims.

What is claimed is:

1. A phase-change memory device comprising:
a phase-change memory cell array including
a first memory block including a plurality of first phase-change memory cells, each connected between a first word line and one of a plurality of bit lines,
a second memory block including a plurality of second phase-change memory cells, each connected between a second word line and one of the plurality of bit lines, and
at least one first pull-down transistor adapted to pull-down a voltage level of the first word line and at least one second pull-down transistor adapted to pull-down a voltage level of the second word line, the first and second pull-down transistors sharing a node; and
a row driver including a first pull-up transistor and a second pull-up transistor adapted to pull-up the voltage level of the first and the second word lines, respectively.

2. The phase-change memory device of claim 1, wherein the at least one first pull-down transistor comprises a first plurality of transistors corresponding to the plurality of first phase-change memory cells, and the at least one second pull-down transistor comprises a second plurality of transistors corresponding to the plurality of second phase-change memory cells.

3. The phase-change memory device of claim 1, wherein the node shared by the first and second pull-down transistors is connected with a ground voltage.

4. The phase-change memory device of claim 1, wherein the first and second pull-up transistors share one node, and the one node shared by the first and second pull-up transistors is connected with a power supply voltage.

5. The phase-change memory device of claim 1, wherein the first and second pull-down transistors are NMOS transistors and the first and second pull-up transistors are PMOS transistors.

6. The phase-change memory device of claim 1, wherein each phase-change memory cell comprises a variable resistive element having a phase-change material comprising at least two resistance values responsive to current flowing through the variable resistive element and an access element controlling the current.

7. The phase-change memory device of claim 6, wherein the access element comprises a cell diode serially connected with the variable resistive element.

8. The phase-change memory device of claim 6, wherein the phase-change material comprises germanium (Ge), antimony (Sb), and tellurium (Te).

9. A phase-change memory device comprising:
a first memory block including a plurality of first phase-change memory cells, each cell connected between a bit line of a plurality of bit lines and a first word line;
a second memory block having a plurality of second phase-change memory cells, each cell connected between a bit line of the plurality of bit lines and a second word line; and
a plurality of first pull-down transistors respectively connected to the plurality of first phase-change memory cells to pull down a voltage level of the first word line, and a plurality of second pull-down transistors respectively connected to the plurality of second phase-change memory cells to pull down a voltage level of the second word line, the first and second pull-down transistors sharing a node.

10. The phase-change memory device of claim 9, wherein write/read currents pass through the first and second pull-down transistors from the first and second memory blocks to the shared node.

11. The phase-change memory device of claim 9, wherein the node shared by the first and second pull-down transistors is connected with a ground voltage.

12. A phase-change memory device comprising:
a semiconductor substrate;
first and second pull-down transistors including first and second gate electrodes corresponding to the first and second transistors, and extending in a predetermined direction on the semiconductor substrate, a common junction region formed in the semiconductor substrate between the first and second gate electrodes and electrically connected with a ground voltage, a first junction region of the first transistor formed opposite to the common junction region with respect to the first gate electrode, and a second junction region of the second transistor formed opposite to the common junction region with respect to the second gate electrode;

a first conductive line extending so as to intersect the first and second gate electrodes on the semiconductor substrate; and first and second phase-change memory cells respectively formed between each of the first and second junction regions and the first conductive line.

13. The phase-change memory device of claim 12, further comprising second conductive lines extending in the predetermined direction on the semiconductor substrate and electrically connected with the first and second junction regions, respectively.

14. The phase-change memory device of claim 13, wherein the first and second phase-change memory cells are formed between each of the second conductive lines and the first conductive line.

15. The phase-change memory device of claim 12, wherein the first conductive line includes a plurality of bit lines extending so as to intersect the first and second gate electrodes on the semiconductor substrate.

16. The phase-change memory device of claim 15, wherein the first phase-change memory cell is formed between the first junction region and each of the plurality of bit lines, respectively, and the second phase-change memory cell is formed between the second junction region and each of the plurality of bit lines, respectively.

17. The phase-change memory device of claim 12, wherein each of the first and second phase-change memory cells comprises a variable resistive element having a phase-change material having at least two resistance values responsive to current flowing through the variable resistive element and an access element controlling the current.

18. The phase-change memory device of claim 17, wherein the phase-change material is arranged substantially parallel to at least a portion of the first conductive line.

19. The phase-change memory device of claim 17, wherein the access element includes a cell diode serially connected with the variable resistive element.

20. The phase-change memory device of claim 12, wherein the phase-change material comprises germanium (Ge), antimony (Sb), and tellurium (Te).

21. A phase-change memory device comprising:
a semiconductor substrate having a first active region and a second active region defined thereon;
a first and a second pull-down transistor including
a first and a second gate electrode extending in a predetermined direction on the first active region and the second active region,
a first common junction region formed in the first active region between first and second gate electrodes,
a first junction region formed opposite to the first common junction region with respect to the first gate electrode, and
a second junction region formed opposite to the first common junction region with respect to the second gate electrode;
a first conductive line extending so as to intersect the first and second gate electrodes on the semiconductor substrate;
a first and a second phase-change memory cell formed between each of the first and second junction regions and the first conductive line; and
a first and a second pull-up transistor including
a second common junction region formed in the second active region between the first and second gate electrodes,
a third junction region formed opposite to the second common junction region with respect to the first gate electrode, and
a fourth junction region formed opposite to the second common junction region with respect to the second gate electrode.

22. The phase-change memory device of claim 21, further comprising second conductive lines extending in the predetermined direction on the semiconductor substrate and electrically connected with the first and second junction regions, respectively.

23. The phase-change memory device of claim 22, wherein the first and second phase-change memory cells are formed between each of the second conductive lines and the first conductive line.

24. The phase-change memory device of claim 21, wherein the first conductive line includes a plurality of conductive lines extending so as to intersect the first and second gate electrodes on the semiconductor substrate.

25. The phase-change memory device of claim 24, wherein the first phase-change memory cell is formed between the first junction region and each of the plurality of bit lines, respectively, and the second phase-change memory cell is formed between the second junction region and each of the plurality of bit lines, respectively.

26. The phase-change memory device of claim 21, wherein the common junction region is electrically connected with a ground voltage.

27. A phase-change memory device comprising:
a semiconductor substrate;
first and second pull-down transistors including
first and second gate electrodes, corresponding to the first and second transistors, and extending in a predetermined direction on the semiconductor substrate,
a common junction region formed in the semiconductor substrate between the first and second gate electrodes,
a first junction region of the first transistor formed opposite to the common junction region with respect to the first gate electrode, and
a second junction region of the second transistor formed opposite to the common junction region with respect to the second gate electrode;
a first conductive line extending so as to intersect the first and second gate electrodes on the semiconductor substrate; and
first and second phase-change memory cells respectively formed between each of the first and second junction regions and the first conductive line, each of the first and second phase-change memory cells comprising a variable resistive element having a phase-change material, comprising at least two resistance values responsive to current flowing through the variable resistive element, and an access element, comprising a cell diode serially connected to the variable resistive element for controlling the current.

* * * * *